United States Patent [19]
Rostoker et al.

[11] Patent Number: 5,557,066
[45] Date of Patent: Sep. 17, 1996

[54] MOLDING COMPOUNDS HAVING A CONTROLLED THERMAL COEFFICIENT OF EXPANSION, AND THEIR USES IN PACKAGING ELECTRONIC DEVICES

[75] Inventors: Michael D. Rostoker, San Jose; Nicholas F. Pasch, Pacifica; Joe Zelayeta, Saratoga, all of Calif.

[73] Assignee: LSI Logic Corporation, Milpitas, Calif.

[21] Appl. No.: 493,956

[22] Filed: Jun. 23, 1995

Related U.S. Application Data

[63] Continuation of Ser. No. 56,344, Apr. 30, 1993, abandoned.

[51] Int. Cl.⁶ ..................................................... H01J 5/00
[52] U.S. Cl. ........................................ 174/52.4; 174/50.61
[58] Field of Search ........................ 174/52.4, 50, 50.61, 174/59; 420/8, 34; 501/55, 60

[56] References Cited

U.S. PATENT DOCUMENTS

| | | | |
|---|---|---|---|
| 4,529,755 | 7/1985 | Nishikawa et al. | 523/436 |
| 5,051,813 | 9/1991 | Schneider et al. | |
| 5,140,109 | 8/1992 | Matsumoto et al. | 174/52.1 |
| 5,165,986 | 11/1992 | Gardner | 174/250 |

*Primary Examiner*—Lincoln Donovan
*Attorney, Agent, or Firm*—Katz & Cotton, LLP

[57] ABSTRACT

Plastic (or resinous) materials used to package (or support) electronic devices typically have thermal coefficients of expansion exceeding that of the device to be packaged. A "loading" material (agent) having a coefficient of expansion significantly less than the "base" plastic material (molding compound), less than that of the die, and preferably zero or negative over a temperature range of interest, is mixed with the "base" plastic material to produce a plastic molding compound with a lower overall thermal coefficient of expansion. Titanium dioxide, zirconium oxide and silicon are discussed as loading agents. The loading material is mixed into the plastic molding compound in sufficient quantity to ensure that the resulting mixture exhibits an overall thermal coefficient of expansion that is more closely matched to that of the electronic device. Reduction of the absolute thermal coefficient of expansion of the plastic material (independent of any matching criteria) additionally serves to reduce thermal stress cracking of plastic package bodies during rapid thermal cycling, such as occurs during vapor soldering.

19 Claims, 1 Drawing Sheet

MOLDING COMPOUNDS HAVING A CONTROLLED THERMAL COEFFICIENT OF EXPANSION, AND THEIR USES IN PACKAGING ELECTRONIC DEVICES

This application is a continuation of application Ser. No. 08/056,344, filed Apr. 30, 1993, entitled "Molding Compounds Having a Controlled Thermal Coefficient of Expansion, and Their Uses in Packaging Electronic Devices," by Michael D. Rostoker, Nicholas F. Pasch and Joe Zelayeta, now abandoned.

TECHNICAL FIELD OF THE INVENTION

The present invention relates to techniques for packaging semiconductor devices, such as integrated circuits and, more particularly, to the following types of plastic-packaged semiconductor devices: DIP (dual in-line package), PQFP (plastic quad flat pack) and PLCC (plastic leaded chip carrier, and the like.

BACKGROUND OF THE INVENTION

Generally speaking, there are four distinct techniques of packaging a semiconductor device, in any case said package having one or more layers of conductive lines (leads, traces, or the like) exiting the package for electrically connecting the packaged die to other components, whether by mounting directly to a printed circuit (mother) board or by plugging the packaged device into a socket which in turn is mounted to the mother board. These are:

(1) plastic molding;
(2) ceramic packaging;
(3) PCB-substrate type packaging; and
(4) tape-based packaging.

Plastic molding typically involves a relatively rigid lead frame, wherein the lead frame has a patterned layer of conductive leads (conductive lines), the inner ends of which define a die-receiving area to which the die is mounted. In some cases, the die is mounted to a die paddle, within the die-receiving area, and is connected to inner end portions of the conductive leads. The die and inner portion of the lead frame are encapsulated by plastic molding compound. Outer end portions of the conductive leads extend outside of the molded plastic body, forming external leads which are typically bent into various configurations (e.g., J-lead, gull wing, etc.).

Molding compounds for plastic packages are typically resins, such as advanced B-stage compounds. For electronic packaging, the preferred resin is epoxy.

Ceramic packaging typically involves one or more layers of conductive traces (conductive lines) applied on interleaved ceramic layers. Again, a die is mounted to a die-receiving area defined by the inner ends of the conductive traces. Outer layers are typically ceramic. The die is mounted in a cavity (either up or down), connected to inner ends of the traces, and the cavity is closed by a lid. Outer ends of the traces are connected, within the ceramic, to external pins or leads (for example) on the exterior of the ceramic package body.

PCB-substrate type packaging involves a patterned layer of conductive traces (conductive lines) on a printed circuit board (PCB) substrate, and the inner ends of the conductive traces define the die-receiving area. The die is mounted to the substrate, connected to the inner ends of the traces, and may be encapsulated by epoxy, or in any suitable manner. Outer ends of the traces are connected to external pins or leads (for example), in a manner similar to ceramic packaging.

Tape-based packaging involves a relatively non-rigid foil of conductive leads (conductive lines), supported by a plastic layer, and the inner ends of the conductive traces define the die-receiving area. A die is mounted to the substrate formed by the layer of conductive leads and plastic, and is connected to the inner ends of the conductive leads. Outer ends of the leads are connected to (or form) external interconnects for the packaged die.

In any of these, or other, packaging techniques, a die connected to conductive lines and having some sort of support and/or package body is referred to as a "semiconductor device assembly".

To one degree or another, each of these packaging techniques suffer from a common problem—namely, when the die heats up (due to operation), it expands. While the package surrounding the die also heats up, it often expands at a rate different than that of the die. For example, many substrate materials (e.g., PCB) exhibit a rate of thermal expansion that differs from that of a silicon die. Package bodies, such as plastic or epoxy, also tend to expand at a different rate than that of the die.

When package elements (substrate, body) do not expand at a rate equal to that of the silicon die (which is normally formed of crystal silicon material), a number of problems are evident. One problem is breakage of the die. Simply stated, a broken die is a failed die. Another problem is evident with respect to the electrical connections (e.g., of the lead frame or the like) to the die. The mismatched expansion of the die and package elements exerts strain on these connections, which may cause them to fail completely. Simply stated, a packaged die with even one failed electrical connection is generally completely useless. These problems are exacerbated by the requirement (i.e., the reality) that the packaged semiconductor device not fail over a wide range of temperatures. Moreover, the problems of thermal expansion mismatch manifest themselves more dramatically when the packaged device experiences relatively rapid temperature changes. Generally, there are two sources of heat affecting semiconductor devices: (1) heat generated internally by the device as it is operating; and (2) heat incident to processing (e.g., packaging) the semiconductor device. For example, vapor soldering exposes the partially-packaged die to very rapid temperature change (i.e., increase in temperature). A reliable packaging technique would be able to accommodate temperature ranges from as low as −25° C. to as high as 125° C.

In the ensuing discussion, the focus is primarily on plastic packaging techniques. Present plastic packaging techniques involve molding a plastic "body" around a semiconductor die. Prior to molding, the die is attached to a lead frame having a plurality of leads ultimately exiting the package body for connecting the semiconductor device to external circuits, such as via conductors on a printed circuit board. Various forms of plastic packs are known, including DIP (Dual In-line Package), PQFP (Plastic Quad Flat Pack) and PLCC (plastic leaded chip carrier). Plastic packages tend to be relatively inexpensive (e.g., vis-a-vis ceramic packages). However, plastic packages are not as durable (hard) as other package types (e.g., ceramic) and are not as hermetic as other package types (e.g., ceramic). Plastic packages tend to be relatively soft, and exhibit a relatively high degree of gas permittivity.

Notwithstanding the above, plastic packaging techniques have proven to be fairly adequate for small (less than ten millimeters on a side) dies. The problem of thermal expansion mismatch between die and package elements is exacerbated as dies become larger and larger. For example, as die sizes have grown beyond 10 mm×10 mm, simple plastic packages have been found to be inadequate (vis-a-vis the effects of thermal expansion mismatch). This problem has been addressed by the use of silicon-based "die coat" materials, which are applied over the die (and typically over bond wires) before the injection molding process is complete. These die coats increase the cost of the packaged device, increase the complexity of the packaging process, and adversely affect the long term reliability of the device due to mobile ion contamination from the die coat. A reliable packaging technique would accommodate large (i.e., greater than ten millimeters on a side) dies as well as small dies, without exerting unacceptable levels of mechanical stress on the die and on the connections to the die.

DISCLOSURE OF THE INVENTION

It is therefore an object of the present invention to provide an improved technique for packaging semiconductor devices.

It is a further object of the present invention to provide improved materials for packaging semiconductor devices.

It is a further object of the present invention to provide semiconductor packaging techniques that do not require the use of a die coat, decrease the cost of the packaged device, decrease the complexity of the packaging process, and ensure the long term reliability of the device by avoiding mobile ion contamination from a die coat.

It is a further object of the present invention to provide the above-referenced objects over a suitable range of operating temperatures.

It is a further object of the present invention to provide the above-referenced objects in a package that is robust with regard to relatively rapid temperature changes.

According to the invention, a semiconductor die (or electronic device) is packaged within a package body, and the thermal coefficient of expansion of the package body closely matches that of the die (or electronic device).

In an embodiment of the invention, the die is packaged within a plastic package body, such as by injection (or transfer) molding. The packaging (e.g., molding) process itself is any of a number of known, suitable processes.

According to a feature of the invention, the plastic material used to package the die initially has a thermal coefficient of expansion exceeding that of the die. For example, a crystal silicon die has a thermal coefficient of expansion of about 2.5 to 30 ppm (parts per million, per °C. over the temperature range of interest), and the plastic material has a thermal coefficient of expansion of about 50–150 ppm.

According to the invention, a "loading" material having a thermal coefficient of expansion ("TCE") significantly less than the "base" plastic material (molding compound), preferably less than that of the die, and more preferably zero or negative over the temperature range of interest, is mixed with the plastic material. For example, titanium dioxide ($TiO_2$), which has a coefficient of thermal expansion of about −10 ppm to 2 ppm is mixed with (combined into) the base plastic molding compound forming the package body, prior to forming the body. The $TiO_2$ is mixed into the plastic molding compound (prior to injection molding) in sufficient quantity to ensure that the resulting mixture of $TiO_2$ and plastic exhibits an overall (combined) thermal coefficient of expansion that is more closely matched to the thermal coefficient of expansion of the die than the plastic (without the $TiO_2$ added thereto). In other words, by mixing $TiO_2$ into the plastic material, the thermal coefficient of expansion of the package body may be lowered. Preferably, the thermal coefficient of expansion of the package body is matched with the thermal coefficient of expansion of the die (or electronic device). The resultant reduced-TCE plastic molding compound will be referred to hereinafter as a "controlled-TCE plastic molding compound". Zirconium Oxide, exhibiting a thermal coefficient of expansion of about −21.7 ppm (in the temperature range of interest) is also suitably employed for loading the plastic compound and lowering the overall thermal coefficient of expansion ("TCE") of the package body. Powdered silicon can also be mixed as a loading agent into the plastic molding compound to lower the overall TCE of the package body.

Two TCE-related goals are set forth by the present invention. A first goal, as stated above, is to closely match the thermal coefficient of expansion of a plastic molding compound to that of a semiconductor die or electronic device encapsulated by the plastic so that the TCE differential between the die and the plastic molding compound is reduced or eliminated. A second goal, unrelated to matching any other TCE, is the absolute reduction (towards zero) of the TCE of the loaded plastic molding compound. According to a feature of the invention, reduction in the absolute TCE of a plastic molded electronic package reduces its (the package's) susceptibility to thermal stress cracking (stress cracking resulting from internal (or external) temperature changes (caused by rapid heating or cooling).

For the purposes of the present specification, "combining into," when referring to a loading material being combined into a base plastic, means mixing the loading material into the base plastic such that the plastic material "adheres" or "bonds" to the loading material. This may, in some cases, require a "wetting agent" or "surfactant" such as a long-chain fluorocarbon to promote the bonding of the plastic to the loading material at a molecular level.

According to a feature of the invention, the temperature range of interest is −25° C. to +125° C.

According to another feature of the invention, a plurality of different loading materials (e.g., titanium dioxide, zirconium oxide, silicon, etc) may be mixed into (combined into) the base plastic molding compound to tailor the overall TCE of the resulting plastic package body.

Other objects, features and advantages of the invention will become apparent in light of the following description thereof.

Figure 1A:
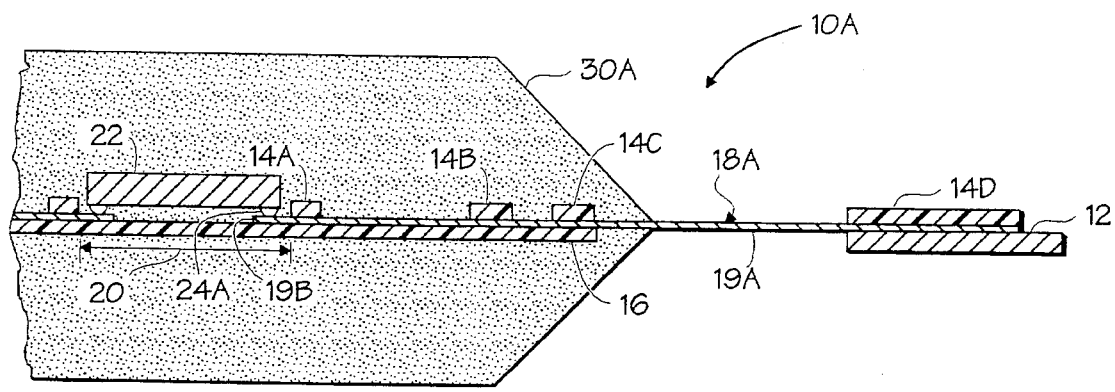
FIG. 1A is a cross-sectional view of a semiconductor device assembly having a controlled-TCE plastic molded body, according to the present invention.

The semiconductor device assemblies (packages) shown and described herein are merely exemplary of the techniques of the present invention.

DETAILED DESCRIPTION OF THE INVENTION

Packaging materials typically used for semiconductor devices typically suffer from one ubiquitous problem: they tend not to match the TCE (thermal coefficient of expansion)

of the crystal silicon material of the semiconductor devices very well. Mismatches of 10–20 ppm/°C. are commonplace, and mismatches of 50–100 ppm/°C. are not unheard of. As previously described, this is not a significant problem for very small dies, since the differential TCE (between the die and the plastic) does not produce great absolute size differences. As semiconductor dies have increased beyond 10 mm by 10 mm, however, the absolute thermally induced size differences have increased to the point where significant mechanical stresses are created between the die and the plastic, producing the potential for "catastrophic" failure of the die. As described hereinabove, various measures have been taken to isolate the semiconductor die from thermal stresses due to these mismatches (e.g., by the use of a silicone rubber "die coat" material).

According to the invention, plastic packaging materials (particularly plastic molding compounds, e.g. epoxy materials) are compounded with a loading agent to make a resulting plastic packaging material which has a TCE much closer to that of a crystalline silicon die contained within the packaging material. This is accomplished by "loading" the base plastic material with a loading material with a lower TCE than that of the un-loaded ("base") plastic. ("Loading" is simply the process of combining, or mixing, the loading material into the base plastic, i.e., creating a mixture of the plastic and the loading material where the plastic "adheres" or "bond" to the loading compound. This may require a "wetting" agent, as described hereinbelow.) The effect of the loading material in the plastic is to reduce the TCE of the loaded plastic to a point somewhere between that of the base plastic and that of the loading material. A suitable loading material is one which is preferably substantially electrically inert (an electrical insulator), and one which has a TCE lower than that of the base plastic, preferably lower than that of a semiconductor die, or most preferably zero or negative. Evidently, the lower the TCE of the loading material, the more profoundly it will offset the relatively high TCE of the base plastic material.

Since virtually all plastic packaging materials have TCEs significantly greater than that of crystalline silicon, any reduction in the TCE of a plastic packaging material represents an improvement in the material for the purpose of packaging semiconductor dies. To have maximum benefit, however, it is necessary to significantly reduce or eliminate the differential TCE between the semiconductor die and the packaging material. At best, a loading material will cause the TCE of the loaded plastic molding compound to "split the difference" between the TCE of the base plastic and the TCE of the loading material as a function of the relative content of the loading compound in the mixture. Therefore, in order to match the TCE of crystalline silicon, it is preferred to use a loading compound with a TCE even lower than that of crystalline silicon. A loading material which has a negative TCE, such as zirconium oxide, will effectively achieve this object.

Negative TCE's are commonly observed in materials which undergo a phase transition from one solid phase to another denser solid phase over a temperature range of interest. In general, commercial and industrial semiconductor device packages are expected to withstand ambient (storage) temperatures in the range of $-25°$ C. (degrees Celsius) to $+125°$ C. There are many materials which exhibit a low or a negative TCE over this range of temperatures. One example is titanium dioxide ($TiO_2$). Another example is Zirconium Oxide. By incorporating titanium dioxide or zirconium oxide, or the like, into the plastic packaging material in appropriate proportions (sufficient amounts), the TCE of the "loaded" plastic packaging material can be made close to or identical to that of crystalline silicon. The appropriate loading concentration for any given plastic and loading compound can be determined empirically. Depending upon the plastic (e.g., a hydrocarbon resin) and the loading compound (loading material, e.g., an oxide such as $TiO_2$) it may be necessary to use a wetting agent (e.g., a long-chain fluorocarbon) to promote good molecular bonding between the plastic and the loading compound. Such wetting techniques and materials are known to those of ordinary skill in the art. Evidently, raw silicon could also be used as a loading agent for the plastic material, but loading agents having even lower TCEs than silicon are preferred for "pulling down" the overall TCE of the plastic body.

Plastic base materials loaded with a loading agent, as described above, are referred to herein as "controlled-TCE" plastics.

Figure 1B:
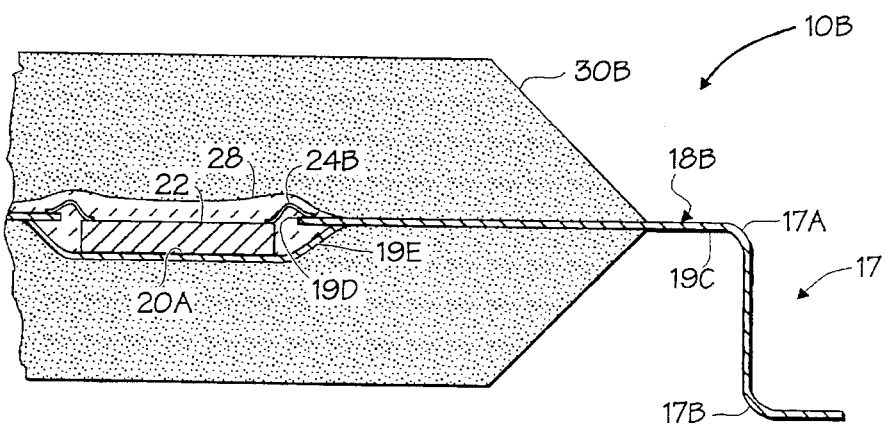
FIG. 1B is a cross-sectional view of another embodiment of a semiconductor device assembly having a controlled-TCE molded body, according to the present invention.

Numerous types of plastic molded packages are known in the art. The controlled-TCE plastic described hereinabove is suited to any plastic package application where differential TCE between a semiconductor die (or other low-TCE component) and a plastic molded body is deemed to be a problem. FIGS. 1A and 1B illustrate two representative applications of the controlled-TCE plastic molding technique of the present invention.

FIG. 1A shows, generally, a tape-mounted semiconductor device assembly 10A. The semiconductor device assembly 10A includes an upper, segmented plastic film layer 14, formed of segments 14A, 14B, 14C and 14D, a lower plastic film layer 16, and a leadframe 18A. The leadframe is made up of a plurality of metallic leads 19A sandwiched between the two plastic layers 14 and 16. A die-receiving area 20 above the plastic film layer 16 is defined generally inside of an innermost ring segment (14A) of the segmented plastic film layer, and includes inner ends 19B of the metallic leads 19A. The inner ends 19B of the metallic leads 19A are supported between the two plastic layers 14 and 16. A semiconductor device 22 is mounted in the die-receiving area 20 via micro-bump bonds 24A connecting the semiconductor device 22 to the leads 19A. In lieu of employing micro-bump bonds (conductive bumps) 24A, bond wires may be employed to connect the device 22 to the leads 19A in a tape automated (TAB) process.

The upper plastic layer 14 does not form a continuous surface, but rather is segmented to include an inner ring portion 14A, one or more intermediate ring portions 14B and 14C disposed outside of the inner ring portion, and an exterior ring portion 14D disposed outside of the intermediate ring portions. The upper plastic layer 14 is formed of a plastic tape, such as KAPTON, and forms a thin, insulating supporting structure for the leadframe 18A. The inside periphery of the inner ring portion 14A supports the innermost ends 19B of the leads 19A. The body 30A, formed of a controlled-TCE plastic molding compound (described hereinbelow), is formed around the device 22, leaving outer portions of the leadframe 18A exposed, exterior the body 30A. The plastic molding compound forming the body 30A is a substantially electrically inert material so that the leads within the body are not shorted out. (In the event that bond wires are used to connect the semiconductor device 22 to the leads 18, a silicone gel encapsulant or other suitable encapsulant, such as described hereinbelow as 28 with respect to FIG. 1B may be employed to protect the bond wires during molding.

A "surrogate" lead frame (edge ring) 12 is provided for handling the semiconductor device assembly during manufacture thereof, and shorts the outer ends of the leads 18 to facilitate electroplating. After molding the body about the device, the semiconductor device assembly is excised from the lead frame 12 and exterior ring portion 14D, neither of which properly form any part of the ultimate semiconductor device assembly 10A.

Another type of molded plastic package is described hereinbelow with respect to FIG. 1B. This type of package is commonly used in plastic DIP and PQFP applications.

FIG. 1B shows, generally, a plastic molded semiconductor device assembly 10B. A metal leadframe 18B made up of a plurality of metallic, conductive leads 19C is clamped in place during the molding process. Often, the leadframe 18B includes one or more sacrificial elements (not shown) to provide mechanical integrity during the molding process. These sacrificial elements are excised after molding. A die-attach paddle 20A is provided as a part of the leadframe, sometimes as an extension of one or more leads (e.g. 19E). A semiconductor device 22 is mounted to the die-attach pad 20A via a suitable adhesive. Bond wires 24B connect the semiconductor device 22 to inner ends 19D of the leads 19C. A layer-like quantity of silicone gel 28, such as Dow Corning Q1-4939 (having, e.g., a 1 to 10 mixing ratio of curing agent to base), encapsulates the leads 24B. A body 30B, formed of a controlled-TCE plastic molding compound (similar to the material of body 30A, FIG. 1A), is formed around the device 22, leaving outer portions of the leadframe 18B exposed, exterior the body. The silicone gel 28 acts as a moisture barrier and a stress relief for the leads 24 during the body molding process. Surface tension between the silicone gel 28 and the leads 24 keeps the silicone gel in place around the leads during assembly of the semiconductor device assembly. After molding of the body 30B, the leads 19C are formed into a "gull-wing" lead configuration 17 by bending them at points generally indicated as 17A and 17B in the Figure.

Some molding processes and materials produce less mechanical stresses than others. In a more "benign" (less mechanically stressing) process, it is not necessary to employ the silicone gel.

An alternative to the silicone gel encapsulant is provided by an encapsulation process whereby the die and its connections (bond wires or bump connections, and inner ends of the leadframe) are coated with a layer of silicon dioxide ($SiO_2$) or other suitable insulating material. A suitable process of this type is described in commonly-owned, copending U.S. patent application Ser. No. 07/985,984, filed Dec. 4, 1992 by Rostoker, (hereinafter ROSTOKER) which describes a technique for making inexpensive "hermetically" sealed devices whereby semiconductor dies and/or passive electronic components are assembled to a substrate or leadframe and are coated with a thin layer of an inorganic, hydrophobic, dielectric material which effectively seals the devices from the outside environment. This technique provides for improved "hermeticity" without the silicone gel encapsulant. This technique (ROSTOKER) also provides an insulating layer between the loaded plastic body and the die, bond wires (if bond wires are used) and leadframe leads, which is important if a conductive loading agent is used to lower the TCE of the base plastic material.

A semiconductor device package molded with a controlled-TCE plastic, such as described hereinabove, exhibits tolerance to extended operating and storage temperature ranges as compared with prior-art "ordinary" plastic molded package. If the ROSTOKER encapsulation technique (or other suitable technique) is employed in combination with the controlled-TCE plastics, the resultant packaged device additionally exhibits hermeticity characteristics closer to those of ceramic packages, than those of "ordinary" plastic molded packages. As a result, such devices can be employed in harsher environments (e.g., wider range of ambient temperatures, higher humidity, etc..) than can "ordinary" packages. Further, the "hermeticity" provided by the ROSTOKER die coating and elimination of mobile ion contamination associated with silicone gel encapsulation results in much greater long-term device reliability.

It will be understood by one of ordinary skill in the art that the present inventive techniques are applicable not only to the encapsulation of semiconductor dies, but also to the encapsulation of any low-TCE (lower than a plastic molding compound) electronic component or assembly (e.g., a hybrid on a ceramic substrate). Accordingly, it is within the spirit and scope of the present invention that the techniques described herein be applied to the encapsulation (molded packaging) of any electronic component or assembly where the use of a controlled-TCE plastic molding compound reduces or eliminates thermally-induced stresses.

It will also be understood that the technique of loading a base material, to modify its overall TCE (e.g., to match the TCE of another element mounted to or within the loaded base material) can be applied, for example, to loading the resinous materials used to form printed circuit substrates to which electronic components are mounted. Although it is assumed herein that a silicon die has a lower TCE than that of an encapsulant or substrate within which or to which it is mounted, and that the TCE of the encapsulant or substrate requires lowering to more closely match that of the die, the technique of the present invention could also be used to elevate rather than lower the TCE of the loaded material, if necessary.

In general, plastic molding compounds produce package bodies which are relatively soft, as compared to ceramics, etc. One of the primary advantages of plastic encapsulated semiconductor devices is low cost. Many loading compounds, being metal oxides or other relatively hard materials, are considerably harder than the base plastic, and serve to increase the effective hardness of the plastic body. Further, the inclusion a loading compound can also serve to reduce the gas permittivity of the resultant plastic body, thereby providing a package with better environmental characteristics.

Another significant benefit of the controlled-TCE plastics is the reduction of package body cracking. Very often during assembly, particularly during vapor soldering, a semiconductor device experiences very rapid temperature changes. Due to the speed of these temperature changes, the temperatures seen throughout the package body are uneven, being higher towards the heat source (analogous to a steak that gets cooked too fast and has a burnt outside and a raw center). Significant temperature differences can occur within the package body material itself, and due to the relatively high TCE of "ordinary" base plastics, significant internal thermally induced stresses occur within "ordinary" plastic molded packages, sometime causing "thermal stress cracking" of the "ordinary" package bodies. However, because of their reduced absolute TCE, the internal stresses resulting from rapid, uneven temperature changes are lessened in packages molded using a controlled-TCE plastic molding compound (according to the present invention), significantly reducing their susceptibility to thermal stress cracking. Accordingly, the present inventive techniques may also be employed to great advantage in reducing the susceptibility of a plastic molded package to thermal stress cracking, independent of any differential TCE goals with respect to a packaged-electronic device. In other words, the loading technique of the present invention has certain absolute advantages as well as certain relative advantages.

As stated hereinabove, any reduction of the TCE of a plastic molding compound which reduces a differential TCE between a die (or encapsulated component) and the molding compound serves to improve the temperature performance of a resultant molded package. According to the present invention, an improved plastic molding compound is provided by "loading" it with a first category of loading agents which have a TCE lower than that of the base plastic, to reduce the differential TCE between the plastic molding compound and a die (or component) to be encapsulated. Silicon, as a loading agent, is exemplary of this category of loading agents.

A greater improvement in differential TCE (for the same amount of loading) results when the plastic molding compound is loaded with a second category of loading agents which have a TCE lower than that of the die (or component) to be encapsulated. In many applications, it is easier to produce a TCE of this type of controlled-TCE plastic molding compound which is closer to (or ever equal to) that of a die (or component) than with a loading compound in the first category. Titanium dioxide, as a loading agent, is exemplary of this category of loading agents.

A still greater improvement results when a third category of loading agents having a TCE less than or equal to zero is used. Zirconium oxide, which has a TCE of about −21.7 ppm/°C., is representative of this third category of loading compound.

It is within the spirit and scope of the present invention that loading compounds in the first, second and third categories be used either alone or in combination with one another to provide a controlled-TCE plastic molding compound for electronic packages exhibiting desired overall TCE characteristics, especially in the context of forming plastic package bodies around a semiconductor die. An exemplary plastic-packaged semiconductor device is shown in commonly-owned U.S. Pat. No. 5,051,813, incorporated by reference herein.

As mentioned hereinabove, an overall goal of the present invention is to match (control) the TCE of a packaging material (e.g., a plastic body, a PCB substrate, or the like) to the "reference" TCE of a component (e.g., a silicon die, or the like) mounted to or within the packaging material.

What is claimed is:

1. A plastic molding compound having a controlled thermal coefficient of expansion, for use in electronic packages, comprising:

a base plastic molding compound having a base thermal coefficient of expansion with a defined temperature range, the base thermal coefficient of expansion being greater than a reference thermal coefficient of expansion;

a loading material combined into the base plastic molding compound, said loading material having a thermal coefficient of expansion less than the base thermal coefficient of expansion within the defined temperature range; and a wetting agent to promote bonding between a mixture of the base plastic molding compound and the loading material.

2. A plastic molding compound, according to claim 1, wherein:

the base plastic molding compound is an epoxy molding compound.

3. A plastic molding compound, according to claim 1, wherein:

the loading material has a thermal coefficient of expansion lower than the reference coefficient of expansion within the defined temperature range.

4. A plastic molding compound, according to claim 1, wherein:

the loading material has a thermal coefficient of expansion less than zero within the defined temperature range.

5. A plastic molding compound, according to claim 1, wherein:

the loading material is titanium dioxide.

6. A plastic molding compound, according to claim 1, wherein:

the loading material is zirconium oxide.

7. A plastic molding compound, according to claim 1, wherein:

the loading material is silicon dioxide.

8. A plastic molding compound, according to claim 1, further comprising:

at least one additional loading material combined into the base plastic molding compound, each additional loading material having a thermal coefficient of expansion less than the base thermal coefficient of expansion within the defined temperature range.

9. A plastic molding compound, according to claim 8, wherein:

the defined temperature range is from −25° C. to +125° C.

10. Method of mounting an electronic component on a substrate, comprising:

providing an electronic component having a first thermal coefficient of expansion;

providing a substrate material having a second thermal coefficient of expansion substantially different than the first thermal coefficient of expansion;

mixing a loading agent into the substrate material to cause an overall thermal coefficient of expansion of the substrate material to more closely match the first coefficient of expansion;

providing a wetting agent to promote bonding between the mixture of the base plastic molding compound and the loading material; and subsequently, mounting the electronic device to the substrate material.

11. Methods according to claim 10, wherein:

the electronic component has a relatively low thermal coefficient of expansion;

the substrate is formed of a material which has a relatively high thermal coefficient of expansion; and the loading agent has a thermal coefficient of expansion lower than the relatively high thermal coefficient of expansion of the substrate material.

12. Method, according to claim 10, wherein:

the electronic component has a relatively low thermal coefficient of expansion;

the substrate is formed of a material which has a relatively high thermal coefficient of expansion; and the loading agent has a thermal coefficient of expansion lower than the relatively low thermal coefficient of expansion of the electronic component.

13. Method, according to claim 10, wherein:

the electronic component has a relatively low thermal coefficient of expansion;

the substrate is formed of a material which has a relatively high thermal coefficient of expansion; and the loading agent has a thermal coefficient of expansion less than zero.

14. A plastic molding compound, according to claim 1, wherein:

the plastic molding compound is an epoxy resin;

the loading compound is a metal oxide; and the wetting agent is a long-chain fluorocarbon.

15. The method of claim 10, further comprising the step of coating the electronic device mounted to the substrate material with an inorganic material.

16. An electronic package comprising:

a leadflame;

an electronic device connected to the leadframe;

an inorganic coating over an inner portion of the leadframe, electronic device and connections therebetween; and a molded plastic body encapsulating the electronic device and the inner portion of the leadframe, said molded plastic body being formed of a mixture of a plastic molding compound and a loading material having a thermal coefficient of expansion lower than the plastic molding compound.

17. A method of making an electronic package, comprising the steps of:

providing an electronic device;

providing a leadframe;

mounting and connecting the electronic device to the leadframe;

forming an inorganic coating over an inner portion of the leadframe, electronic device and connections therebetween and forming a package body around the coated electronic device and the inner portion of the leadframe using a mixture of a plastic molding compound and a loading material having a controlled thermal coefficient of expansion lower than the plastic molding compound.

18. A method of making a plastic molding compound having a controlled thermal coefficient of expansion for electronic packaging, comprising the steps of:

providing a base plastic molding compound having a base thermal coefficient of expansion at a defined temperature range greater than a reference thermal coefficient of expansion of an electronic device to be encapsulated; and combining into the base plastic molding compound a loading material with a wetting agent to promote bonding between the base plastic molding compound and the loading material, said loading material having a thermal coefficient of expansion less than the base thermal coefficient of expansion within the defined temperature range so that the thermal coefficient of expansion of the mixture is less than the base thermal coefficient of expansion.

19. A method of packaging an electronic device, comprising the steps of:

providing an electronic device having a first thermal coefficient of expansion;

coating the electronic device with an inorganic material so as to seal the electronic device from an outside environment;

providing a package body material having a second thermal coefficient of expansion substantially different from the first thermal coefficient of expansion;

mixing a loading agent into the package body material to cause an overall thermal coefficient of expansion of the package body material to more closely match the first thermal coefficient of expansion; and encapsulating the coated electronic device in the package body material.

* * * * *